United States Patent
Hong et al.

(10) Patent No.: US 9,812,513 B2
(45) Date of Patent: Nov. 7, 2017

(54) LIGHT EMITTING DISPLAY DEVICE AND METHOD OF MANUFACTURING THE SAME

(71) Applicant: Samsung Display Co., Ltd., Yongin (KR)

(72) Inventors: Jung-Moo Hong, Seoul (KR); Young Do Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 99 days.

(21) Appl. No.: 14/559,730

(22) Filed: Dec. 3, 2014

(65) Prior Publication Data

US 2015/0206926 A1 Jul. 23, 2015

(30) Foreign Application Priority Data

Jan. 20, 2014 (KR) ........................ 10-2014-0006810

(51) Int. Cl.
| | | |
|---|---|---|
| G06F 3/041 | (2006.01) | |
| G06F 3/044 | (2006.01) | |
| H01L 27/32 | (2006.01) | |
| H01L 51/52 | (2006.01) | |

(52) U.S. Cl.
CPC ............ *H01L 27/322* (2013.01); *G06F 3/044* (2013.01); *G06F 3/0412* (2013.01); *H01L 27/323* (2013.01); *H01L 51/5284* (2013.01); *G06F 3/041* (2013.01); *G06F 2203/04103* (2013.01); *H01L 27/3211* (2013.01); *H01L 51/5237* (2013.01)

(58) Field of Classification Search
CPC ........ G06F 3/041; G06F 3/0412; G06F 3/044; G06F 2203/04103; H01L 27/3211; H01L 27/322; H01L 27/323; H01L 51/5237; H01L 51/5284

See application file for complete search history.

(56) References Cited

U.S. PATENT DOCUMENTS

| | | | | |
|---|---|---|---|---|
| 2003/0230972 | A1* | 12/2003 | Cok | .................... H01L 27/3211 313/504 |
| 2004/0195572 | A1* | 10/2004 | Kato | .................... H01L 21/8221 257/72 |
| 2004/0252867 | A1* | 12/2004 | Lan | ...................... G06K 9/0004 382/124 |
| 2005/0007014 | A1* | 1/2005 | Kurata | ................ H01L 51/5234 313/504 |
| 2006/0077167 | A1* | 4/2006 | Kim | .................. G02F 1/133555 345/98 |

(Continued)

FOREIGN PATENT DOCUMENTS

| | | |
|---|---|---|
| JP | 2007-003825 | 1/2007 |
| JP | 2012-146517 | 8/2012 |

(Continued)

*Primary Examiner* — Michael J Eurice
(74) *Attorney, Agent, or Firm* — H.C. Park & Associates, PLC

(57) ABSTRACT

A light emitting display device including a light emitting display panel including light emitting areas, a non-light emitting area disposed adjacent to the light emitting areas, and light emitting devices respectively disposed in the light emitting areas, and a touch panel disposed on the display panel, the touch panel including color filters respectively facing the light emitting areas.

18 Claims, 11 Drawing Sheets

(56) References Cited

U.S. PATENT DOCUMENTS

| | | | |
|---|---|---|---|
| 2006/0118697 A1* | 6/2006 | Lee | G01J 1/32 250/205 |
| 2006/0244693 A1* | 11/2006 | Yamaguchi | G02F 1/13338 345/76 |
| 2007/0052345 A1* | 3/2007 | Wano | H01J 1/70 313/504 |
| 2007/0170949 A1* | 7/2007 | Pak | G09G 3/006 324/760.01 |
| 2007/0207571 A1* | 9/2007 | Morisue | H01L 27/1214 438/107 |
| 2008/0030483 A1* | 2/2008 | Choo | G06F 3/0436 345/173 |
| 2008/0192018 A1* | 8/2008 | Park | G06F 3/0412 345/173 |
| 2008/0211395 A1* | 9/2008 | Koshihara | G06F 3/044 313/504 |
| 2008/0211786 A1* | 9/2008 | Park | G02F 1/13338 345/175 |
| 2008/0212000 A1* | 9/2008 | French | G02F 1/133305 349/106 |
| 2009/0161051 A1* | 6/2009 | Fukunaga | G06F 3/0421 349/115 |
| 2010/0059754 A1* | 3/2010 | Lee | H01L 27/322 257/59 |
| 2010/0231542 A1* | 9/2010 | Momose | G06F 3/044 345/173 |
| 2011/0050642 A1* | 3/2011 | Lee | G02F 1/167 345/175 |
| 2011/0109592 A1* | 5/2011 | Kurokawa | G06F 3/0412 345/175 |
| 2011/0248978 A1* | 10/2011 | Koyama | G06F 3/0412 345/211 |
| 2012/0001847 A1* | 1/2012 | Kozuma | G06F 3/042 345/156 |
| 2012/0169636 A1* | 7/2012 | Liu | G06F 3/0412 345/173 |
| 2012/0319966 A1* | 12/2012 | Reynolds | G06F 3/041 345/173 |
| 2013/0127739 A1* | 5/2013 | Guard | G06F 3/044 345/173 |
| 2013/0162549 A1* | 6/2013 | Kim | G06F 3/0412 345/173 |
| 2013/0188103 A1* | 7/2013 | Jeng | G06F 3/041 349/12 |
| 2013/0229357 A1* | 9/2013 | Powell | G06F 3/0412 345/173 |
| 2013/0335680 A1* | 12/2013 | Su | H01L 51/5036 349/69 |
| 2014/0014960 A1* | 1/2014 | Yamazaki | G06F 3/0412 257/59 |
| 2014/0043546 A1* | 2/2014 | Yamazaki | G02F 1/13338 349/12 |
| 2014/0061597 A1* | 3/2014 | Choi | H01L 51/5284 257/40 |
| 2014/0063364 A1* | 3/2014 | Hirakata | G06F 1/1692 349/12 |
| 2014/0111711 A1* | 4/2014 | Iwami | B32B 7/02 349/12 |
| 2014/0125879 A1* | 5/2014 | Chiu | G06F 3/0412 349/12 |
| 2014/0132870 A1* | 5/2014 | Kubota | G02F 1/1396 349/43 |
| 2014/0139761 A1* | 5/2014 | Yanagawa | G06F 3/044 349/12 |
| 2014/0146033 A1* | 5/2014 | Koyama | G09G 3/3655 345/212 |
| 2014/0184484 A1* | 7/2014 | Miyake | G09G 3/3677 345/87 |
| 2014/0184968 A1* | 7/2014 | Niikura | G02F 1/1396 349/42 |
| 2014/0252386 A1* | 9/2014 | Ito | H01L 51/524 257/98 |
| 2014/0361290 A1* | 12/2014 | Yamazaki | H01L 27/1225 257/43 |
| 2014/0368756 A1* | 12/2014 | Lee | G06F 3/0412 349/12 |
| 2015/0060817 A1* | 3/2015 | Sato | H01L 27/323 257/40 |
| 2015/0060933 A1* | 3/2015 | Ohno | H01L 51/5237 257/99 |
| 2015/0097810 A1* | 4/2015 | Aoki | G06F 3/044 345/174 |
| 2015/0185942 A1* | 7/2015 | Kim | G06F 3/0412 345/173 |
| 2015/0206926 A1* | 7/2015 | Hong | H01L 27/322 345/173 |
| 2015/0331508 A1* | 11/2015 | Nho | G06F 3/0421 345/173 |
| 2016/0070383 A1* | 3/2016 | Toyoshima | H01L 27/323 345/174 |
| 2016/0224166 A1* | 8/2016 | Yamazaki | G02F 1/13338 |
| 2016/0299613 A1* | 10/2016 | Alonso | G06F 3/0414 |
| 2016/0378224 A1* | 12/2016 | Kwon | H01L 51/5256 345/174 |

FOREIGN PATENT DOCUMENTS

| | | |
|---|---|---|
| KR | 10-0567178 | 4/2006 |
| KR | 10-0915616 | 7/2009 |
| KR | 10-2010-0075746 | 7/2010 |
| KR | 10-2010-0079369 | 7/2010 |

* cited by examiner

LIGHT EMITTING DISPLAY DEVICE AND METHOD OF MANUFACTURING THE SAME

CROSS-REFERENCE TO RELATED APPLICATION

This application claims priority from and the benefit of Korean Patent Application No. 10-2014-0006810, filed on Jan. 20, 2014, which is hereby incorporated by reference for all purposes as if fully set forth herein.

BACKGROUND

Field

Exemplary embodiments of present disclosure relate to a light emitting display device and a method of manufacturing the same. More particularly, exemplary embodiments of the present disclosure relate to a light emitting display device having improved display quality and a method of manufacturing the light emitting display device.

Discussion of the Background

A light emitting display device includes a display panel and various functional optical films. The functional optical films are disposed on at least one surface of the display panel.

To prevent an external light from being reflected, the light emitting display device generally includes a polarizing film and a $\lambda/4$ wavelength film. The polarizing film and the $\lambda/4$ wavelength film cause a decrease in the brightness of an image and increase the cost of the light emitting display device.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present disclosure provide a light emitting display device having enhanced brightness and reduced manufacturing cost.

Exemplary embodiments of the present disclosure also provide a method of manufacturing the light emitting display device.

Additional features of the invention will be set forth in the description which follows, and in part will be apparent from the description, or may be learned by practice of the invention.

Exemplary embodiment of the present inventive concept provides a light emitting display device, including a light emitting display panel including light emitting areas, a non-light emitting area disposed adjacent to the light emitting areas, and light emitting devices respectively disposed in the light emitting areas, and a touch panel disposed on the display panel, the touch panel including color filters respectively facing the light emitting areas.

Exemplary embodiment of the present inventive concept provides a light emitting display device, including a display panel including a first pixel area, a second pixel area, a non-light emitting area disposed adjacent to the first pixel area and the second pixel area, and a first light emitting device and a second light emitting device respectively facing the first pixel area and the second pixel area, a touch panel disposed on the display panel, the touch panel including a first color filter and a second color filter respectively facing the first pixel area and the second pixel area, and an adhesive member configured to adhere an upper surface of the display panel and a lower surface of the touch panel.

Exemplary embodiment of the present inventive concept also provides a method of manufacturing a light emitting display device, including forming a first color filter and a second color filter respectively on a surface of a touch panel, the first color filter and the second color filter respectively facing a first pixel area and a second pixel area of the touch panel, and attaching the touch panel to the display panel, such that the first color filter and the second color filter are disposed between the touch panel and the display panel, the first color filter and the second color filter respectively facing the first pixel area and the second pixel area.

According to the above, a polarizing film and a $\lambda/4$ wavelength film, which are used to prevent the external light from being reflected, are replaced with the color filters. Therefore, the manufacturing cost of the light emitting display device is reduced. The color filters have a higher emitted light efficiency higher than that of the polarizing film and the $\lambda/4$ wavelength film. Thus, the brightness of the display panel is enhanced.

In addition, since the color filters are disposed on the touch panel, the display panel does not need to include a separate substrate for the color filters. Accordingly, the thickness of the light emitting display device is slimmed.

Further, since the color filter is formed before the display panel is coupled to the display panel, the manufacturing process of the light emitting display device is simplified.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
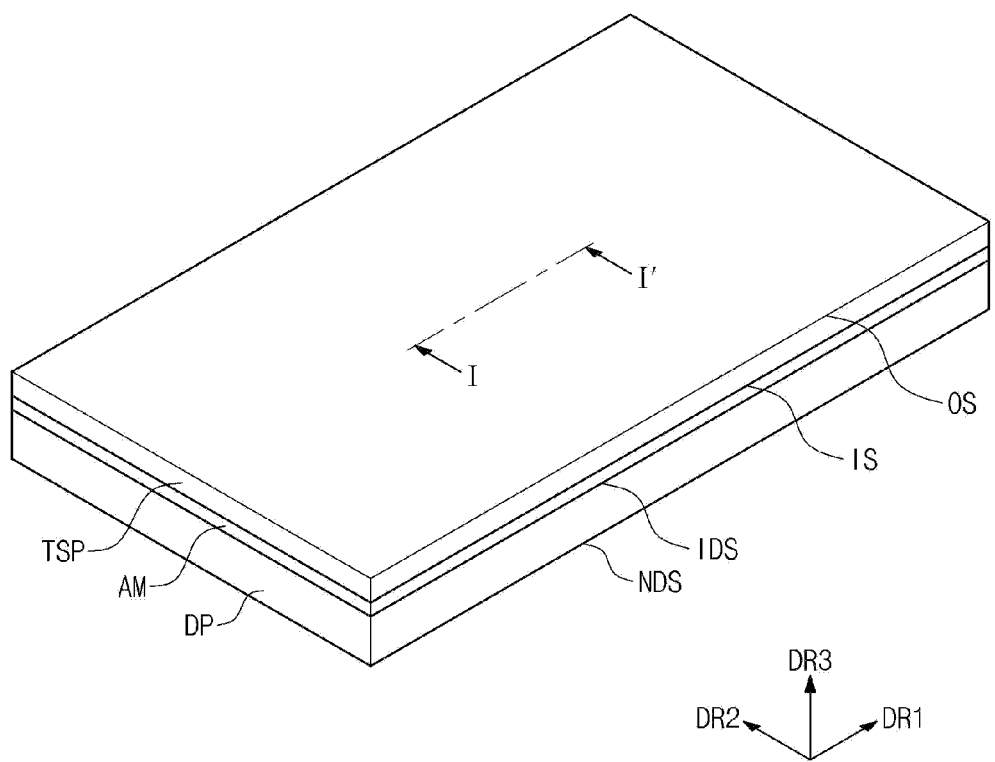
FIG. 1 is a perspective view showing a light emitting display device according to an exemplary embodiment of the present disclosure.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
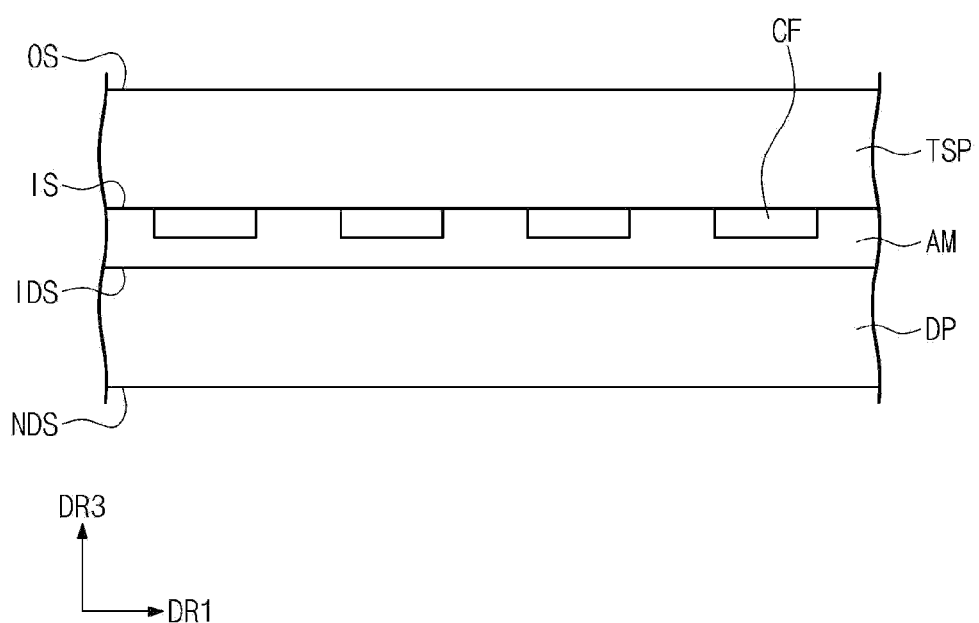
FIG. 2 is a cross-sectional view taken along line I-I' of FIG. 1.

FIG. 1 is a perspective view showing a light emitting display device according to an exemplary embodiment of the present disclosure, and FIG. 2 is a cross-sectional view taken along line I-I' of FIG. 1.

Referring to FIGS. 1 and 2, the light emitting display device (hereinafter, referred to as a display device) includes a light emitting display panel DP (hereinafter, referred to as a display panel) and a touch panel TSP coupled to the display panel DP by an adhesive member AM. The display device may further include functional members, such as a window member, a protective member, etc.

The display panel DP may include a base substrate (not shown), a plurality of signal lines (not shown) disposed on the base substrate, and a plurality of pixels (not shown) electrically connected to the signal lines. The plurality of pixels may respectively include display elements. The display elements are configured to generate images on the basis of signals provided from the signal lines.

The display elements may be self-emissive elements. According to an exemplary embodiment of the present invention, an organic light emitting display panel will be described as the display panel DP, but the present invention should not be limited thereto, and different self-emissive display panel, e.g., a plasma display panel, may be used as the display panel DP.

The display panel DP includes a display surface IDS (or an upper surface) disposed in a plane extending in a first direction DR1 and a second direction DR2 substantially perpendicular to the first direction DR1. The image is displayed through the display surface IDS. The display panel DP also includes a non-display surface NDS (or a lower surface) on the side of the display panel DP opposite to the display surface IDS. A protective member (not shown) may be coupled to the non-display surface NDS to protect the display panel DP.

The touch panel TSP is disposed above the display panel DP in the third direction DR3. The touch panel TSP senses an external input occurring on the display device. When a user's finger or an electric pen touches a specific position (hereinafter, referred to as an input position) on an upper surface OS of the touch panel TSP, the touch panel TSP obtains coordinate information of the input position. The touch panel TSP may sense the external input in various ways, including using electrostatic capacitance, a resistive film, electromagnetic induction, etc.

A plurality of color filters CF is disposed on a lower surface IS of the touch panel TSP. The color filters CF include color filters CF having two or more different colors. Each color filter CF may be an organic layer including pigments or dyes.

The display panel DP and the touch panel TSP are coupled to each other by the adhesive member AM. The adhesive member AM may be a pressure sensitive adhesive sheet that includes a polymer, a cross-linking agent, and a resin. The polymer may include at least one of an acryl-based polymer, a silicon-based polymer, and a urethane-based polymer.

The adhesive member AM is disposed between the display surface IDS of the display panel DP and the lower surface IS of the touch panel TSP, to attach the display panel DP to the touch panel TSP. As shown in FIG. 2, the adhesive member AM covers the color filters CF.

Figure 3:
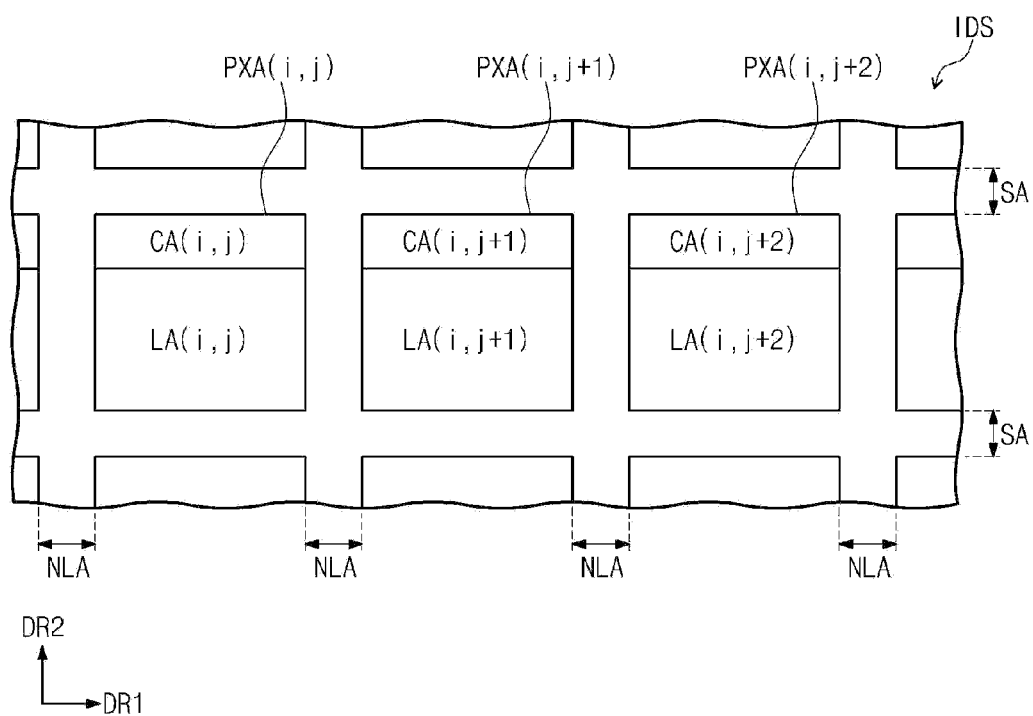
FIG. 3 is a top plan view showing a display panel according to an exemplary embodiment of the present disclosure.

FIG. 3 is a top plan view showing a display panel according to an exemplary embodiment of the present disclosure.

Referring to FIG. 3, the display surface IDS includes a plurality of pixel areas PXA(i, j) to PXA(i, j+2) and a non-light emitting area SA adjacent to the pixel areas PXA(i, j) to PXA(i, j+2). FIG. 3 shows first to third pixel areas PXA(i, j) to PXA(i, j+2).

The first to third pixel areas PXA(i, j) to PXA(i, j+2) respectively include light emitting areas LA(i, j) to LA(i, j+2) and circuit areas CA(i, j) to CA(i, j+2) adjacent to the light emitting areas LA(i, j) to LA(i, j+2). A light emitting device (not shown) of a corresponding pixel (not shown) is disposed in each of the light emitting areas LA(i, j) to LA(i, j+2), and a circuit part (not shown) of the corresponding pixel is disposed in each of the circuit areas CA(i, j) to CA(i, j+2). The signal lines are disposed in the non-light emitting area SA.

The first to third pixel areas PXA(i, j) to PXA(i, j+2) display lights having different colors in accordance with a corresponding light emitting device. The first pixel area PXA(i, j) may display a red light, the second pixel area PXA(i, j+1) may display a green light, and the third pixel area PXA(i, j+2) may display a blue light. However, present invention is not limited thereto. For example, the first to third pixel areas PXA(i, j) to PXA(i, j+2) may respectively display cyan, magenta, and yellow light.

Each of the light emitting areas LA(i, j) to LA(i, j+2) may be defined as an area of the corresponding pixel that overlaps the light emitting device. The circuit areas CA(i, j) to CA(i, j+2) may be omitted according to an arrangement relation between the circuit part and the light emitting device. In other words, the first to third pixel areas PXA(i, j) to PXA(i, j+2) may be substantially the same as the light emitting areas LA(i, j) to LA(i, j+2).

Figure 4:
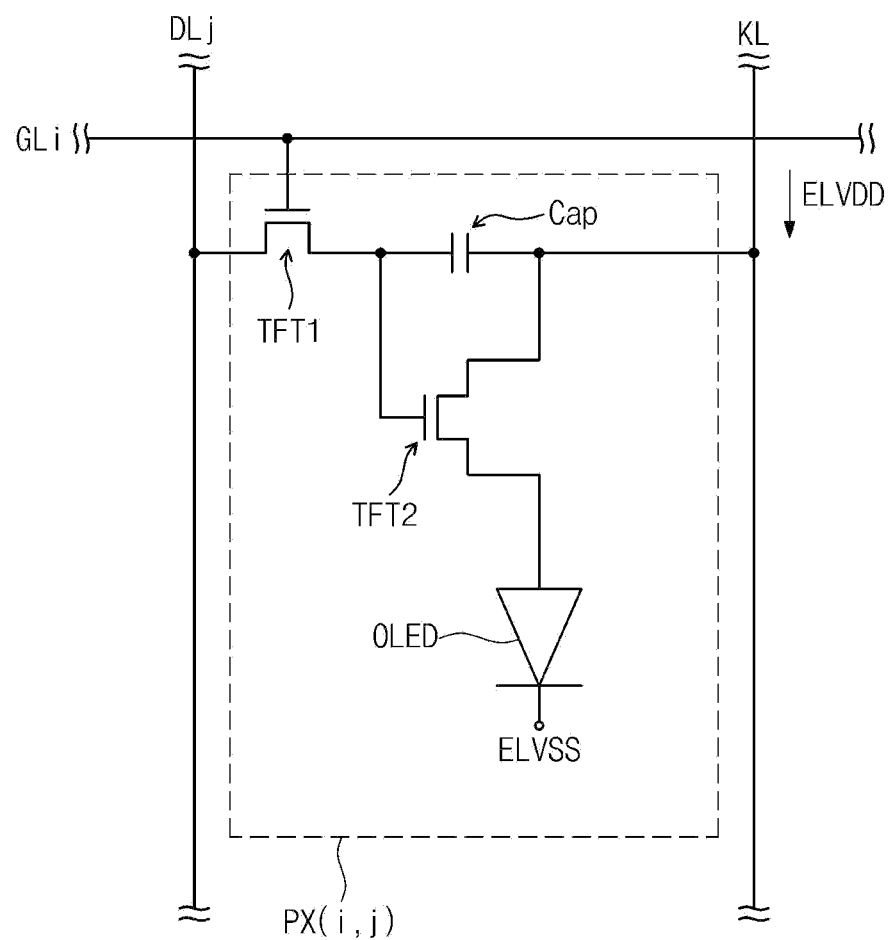
FIG. 4 is an equivalent circuit diagram showing a pixel according to an exemplary embodiment of the present disclosure.

FIG. 4 is an equivalent circuit diagram showing a pixel according to an exemplary embodiment of the present disclosure. FIG. 4 shows the equivalent circuit diagram of the pixel PX(i, j) disposed in the first pixel area PXA(i, j).

Referring to FIG. 4, the pixel PX(i, j) receives a gate signal from an i-th gate line GLi and a data signal from a j-th data line DLj. The pixel PX(i, j) receives a first source voltage ELVDD from a source voltage line KL.

The pixel PX(i, j) includes an organic light emitting diode OLED as the light emitting device. The pixel PX(i, j) includes a first thin film transistor TFT1, a second thin film transistor TFT2, and a capacitor Cap as the circuit part to drive the organic light emitting diode OLED.

The first thin film transistor TFT1 outputs the data signal applied to the j-th data line DLj in response to the gate signal applied to the i-th gate line GLi. The capacitor Cap is charged with a voltage corresponding to the data signal provided from the first thin film transistor TFT1.

The second thin film transistor TFT2 is connected to the organic light emitting diode OLED. The second thin film transistor TFT2 controls a driving current flowing through the organic light emitting diode OLED in response to the amount of electric charge charged in the capacitor Cap.

The organic light emitting diode OLED includes a first electrode (not shown) connected to the second thin film transistor TFT2, and a second electrode (not shown) that receives a second source voltage ELVSS. The second source voltage ELVSS has a voltage level lower than that of the first source voltage ELVDD. The organic light emitting diode OLED includes an organic light emitting layer disposed between the first electrode and the second electrode. The organic light emitting diode OLED emits the light during the turn-on period of the second thin film transistor TFT2.

Figure 5:
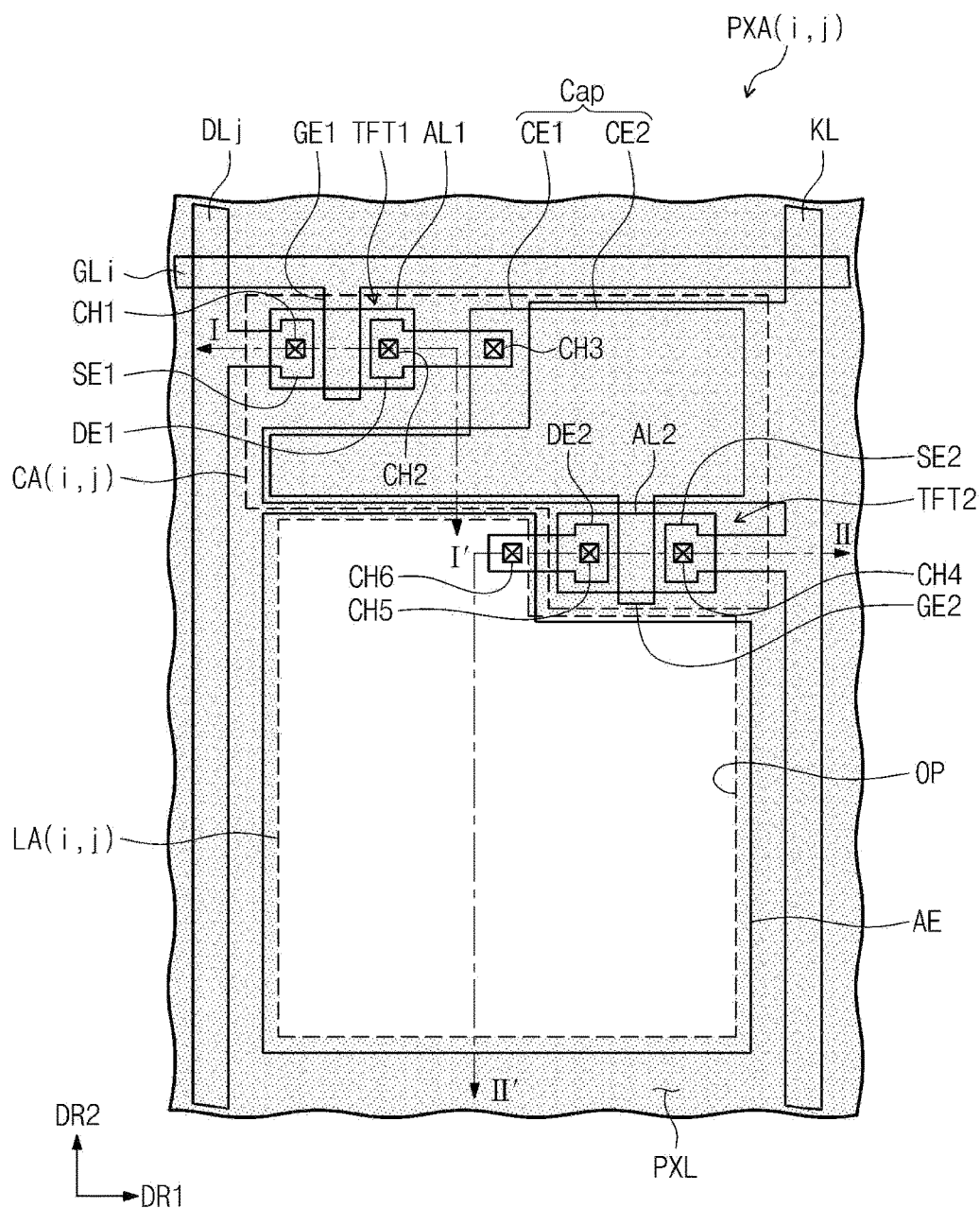
FIG. 5 is a layout diagram showing a pixel according to an exemplary embodiment of the present disclosure.
Figure 6:
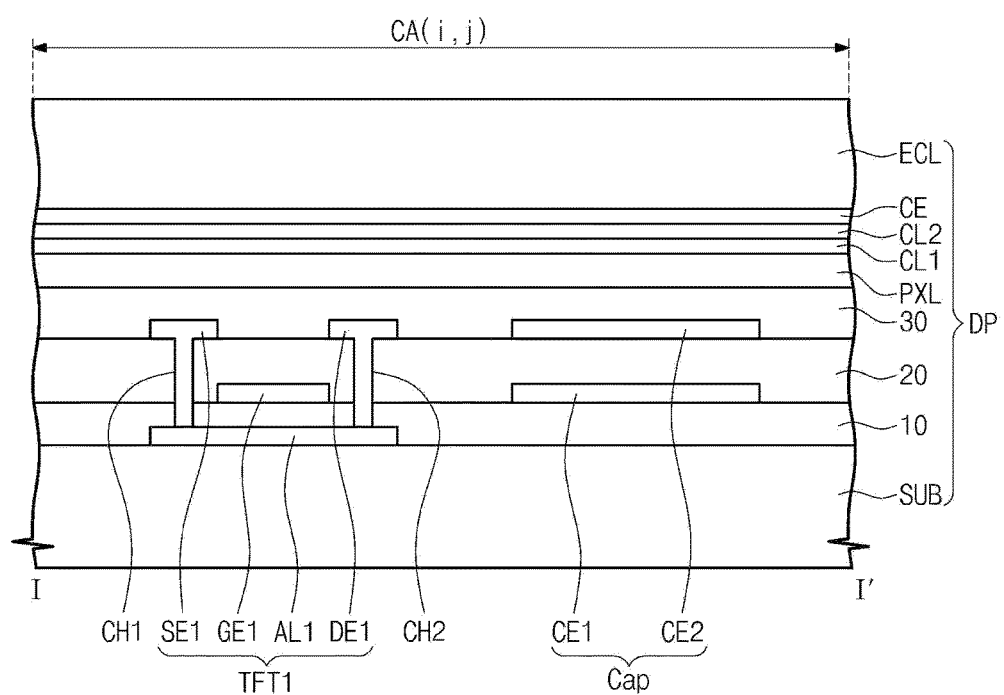
FIG. 6 is a cross-sectional view taken along line I-I' of FIG. 5.
Figure 7:
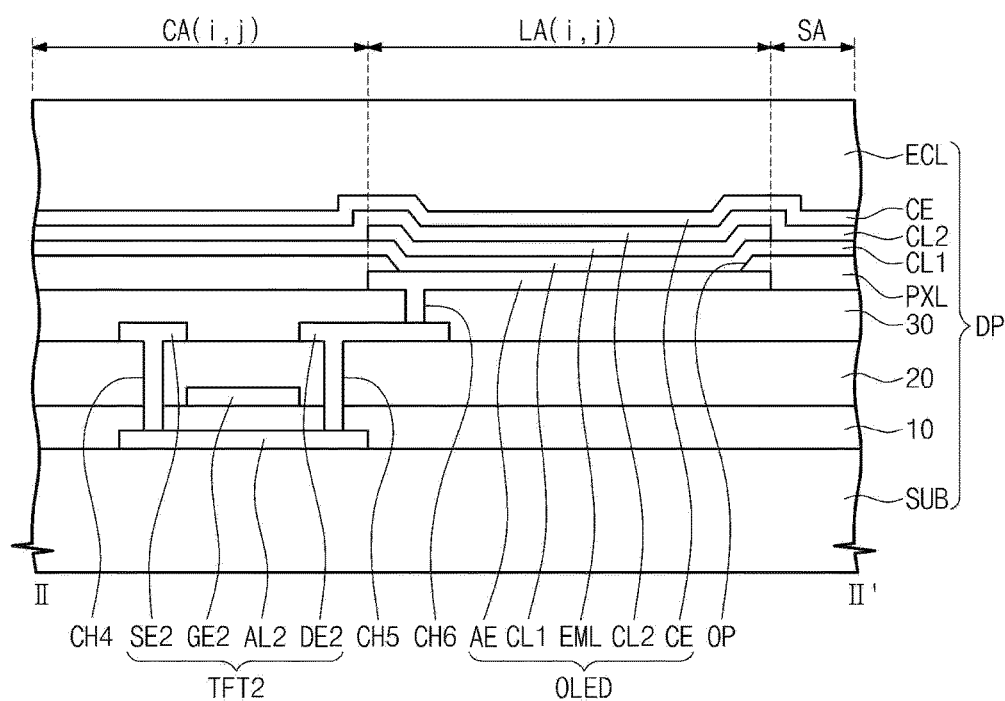
FIG. 7 is a cross-sectional view taken along line II-II' of FIG. 5.

FIG. 5 is a layout diagram showing a pixel according to an exemplary embodiment of the present disclosure, FIG. 6 is a cross-sectional view taken along a line I-I' of FIG. 5, and FIG. 7 is a cross-sectional view taken along a line II-II' of FIG. 5.

The display panel DP includes a base substrate SUB, a light emitting device layer disposed on the base substrate SUB, and a sealing layer ECL. The light emitting device layer includes a plurality of insulating layers and a plurality of conductive layers, disposed between the base substrate SUB and the sealing layer ECL.

Referring to FIG. 5, the i-th gate line GLi, the j-th data line DLj, and the source voltage line KL are disposedwithin the non-light emitting area SA. The first thin film transistor TFT1, the second thin film transistor TFT2, and the capacitor Cap are disposedwithin the circuit area CA(i, j).

An anode AE of the organic light emitting diode OLED overlaps with the light emitting area LA(i, j). In the present exemplary embodiment, the light emitting area LA(i, j) has substantially the same area as that of the organic light emitting diode OLED. The area of the organic light emitting diode OLED corresponds to the area of the anode AE.

Referring to FIGS. 6 and 7, a first semiconductor pattern AU of the first thin film transistor TFT1 and a second semiconductor pattern AL2 of the second thin film transistor TFT2 are disposed on the base substrate SUB. The base substrate SUB may be at least one of a glass substrate, a metal substrate, and a plastic substrate. The base substrate SUB may be flexible.

A first insulating layer 10 is disposed on the base substrate SUB to cover the first and second semiconductor patterns AL1 and AL2. The first insulating layer 10 may include at least one of an organic layer and an inorganic layer.

A second insulating layer 20 is disposed on the first insulating layer 10 to cover a first control electrode GE1, a second control electrode GE2, and a first electrode CE1. The second insulating layer 20 may include at least one of an organic layer and an inorganic layer.

A first input electrode SE1 and a first output electrode DE1 of the first thin film transistor TFT1 are disposed on the second insulating layer 20. A second input electrode SE2 and a second output electrode DE2 of the second thin film transistor TFT2 are disposed on the second insulating layer 20. A second electrode CE2 of the capacitor Cap is disposed on the second insulating layer 20.

The first input electrode SE1 and the first output electrode DE1 are connected to the first semiconductor pattern AL1 respectively through first and second contact holes CH1 and CH2 formed through the first and second insulating layers 10 and 20. The first output electrode DE1 is connected to the first electrode CE1 through a third contact hole CH3 formed through the second insulating layer 20. The second input electrode SE2 and the second output electrode DE2 are connected to the second semiconductor pattern AL2 respectively through fourth and fifth contact holes CH4 and CH5 formed through the first and second insulating layers 10 and 20. According to an embodiment, each of the first and second thin film transistors TFT1 and TFT2 may have a bottom gate structure.

A third insulating layer 30 is disposed on the second insulating layer 20 to cover the first input electrode SE1, the first output electrode DE1, the second input electrode SE2, and the second output electrode DE2. The third insulating layer 30 includes at least one of an organic layer and an inorganic layer.

The organic light emitting diode OLED is disposed on the third insulating layer 30. The organic light emitting diode OLED includes the anode AE, a first common layer CL1, an organic light emitting layer EML, a second common layer CL2, and a cathode CE, sequentially stacked. The anode AE is connected to the second output electrode DE2 through a sixth contact hole CH6 formed through the third insulating layer 30. Positions of the anode AE and the cathode CE may be changed with respect to each other, according to the light emission direction of the organic light emitting diode OLED.

The anode AE is disposed on the third insulating layer 30 and a pixel definition layer PXL is disposed on the third insulating layer 30. The pixel definition layer PXL may define an opening OP to expose at least a portion of the anode AE.

The first common layer CL1 is disposed on the anode AE. The first common layer CL1 is disposed in the light emitting area LA(i, j) and in the circuit area CA(i, j). The first common layer CL1 may also be disposed in the non-light emitting area SA. In other words, the first common layer CL1 overlaps the entire base substrate SUB. The first common layer CL1 includes a hole injection layer. The first common layer CL1 may further include a hole transport layer.

The organic light emitting layer EML is disposed on the first common layer CL1. The organic light emitting layer EML may have substantially the same area as that of the anode AE when viewed in a plan view. The organic light emitting diode OLED displays one of the red, green, and blue light, in accordance with a host or dopant included in the organic light emitting layer EML.

The second common layer CL2 is disposed on the organic light emitting layer EML. The second common layer CL2 may overlap the entire base substrate SUB like the first common layer CL1. The second common layer CL2 includes an electron injection layer. The second common layer CL2 may further include an electron transport layer. The cathode CE is disposed on the second common layer CL2. The cathode CE overlaps the entire base substrate SUB.

The sealing layer ECL is disposed on the cathode CE. The sealing layer ECL overlaps with the light emitting area LA(i, j), the circuit area CA(i, j), and the non-light emitting area SA. The sealing layer ECL includes a plurality of inorganic layers. The inorganic layers include at least one of silicon nitride and silicon oxide. The sealing layer ECL may further include other functional layers disposed between the inorganic layers. The touch panel TSP (refer to FIG. 2) is disposed on the sealing layer ECL.

Figure 8:
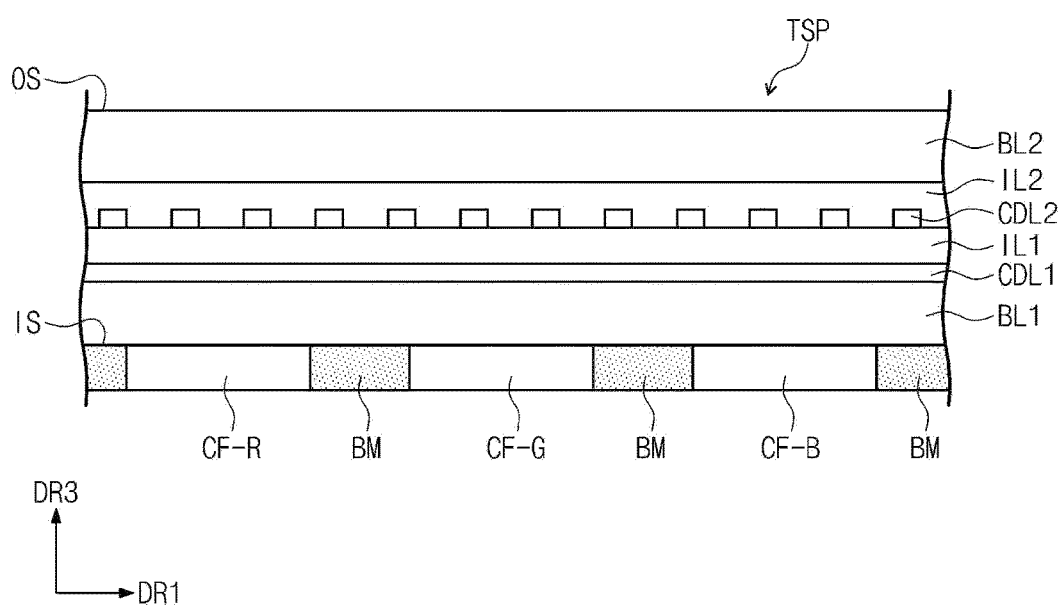
FIG. 8 is a cross-sectional view showing a touch panel according to an exemplary embodiment of the present disclosure.
Figure 9:
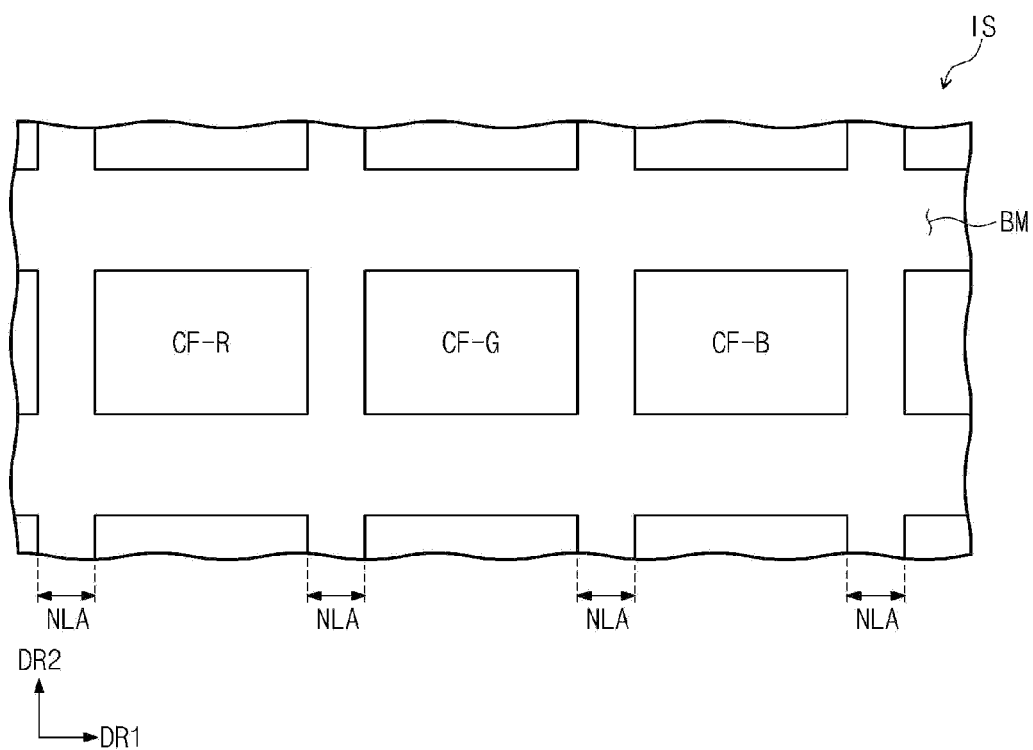
FIG. 9 is a bottom plan view showing a touch panel according to an exemplary embodiment of the present disclosure.

FIG. 8 is a cross-sectional view showing a touch panel TSP according to an exemplary embodiment of the present disclosure and FIG. 9 is a bottom plan view showing a touch panel according to an exemplary embodiment of the present disclosure. FIG. 8 shows the electrostatic capacitive type touch panel and FIG. 9 shows first, second, and third color filters CF-R, CF-G, and CF-B.

Referring to FIG. 8, the touch panel TSP includes a first base layer BL1, and a first conductive layer CDL1, a first inner layer IL1, a second conductive layer CDL2, a second inner layer IL2, and a second base layer BL2, sequentially stacked on the first base layer BL1. The first and second base layers BL1 and BL2 may be a plastic film. The first and second inner layers IL1 and IL2 include an insulating material. The first and second conductive layers CDL1 and CDL2 include a transparent conductive material.

Each of the first and second conductive layers CDL1 and CDL2 includes conductive patterns. The first conductive layer CDL1 includes conductive patterns extending in the first direction DR1, arranged in the second direction DR2, and the second conductive layer CDL2 includes conductive patterns extending in the second direction DR2, arranged in the first direction DR1. FIG. 8 shows one conductive pattern included in the first conductive layer CDL1 and twelve conductive patterns included in the second conductive layer CDL2.

When the touch panel TSP is an electrostatic capacitive type touch panel, the touch panel TSP senses a variation in capacitance occurring in the second base layer BL2, when the user's finger or the electric pen touches the second base layer BL2, and calculates the coordinate information of the input position. The first and second conductive layers CDL1 and CDL2 may include various conductive patterns according to exemplary embodiments of the touch panel.

A lower surface of the first base layer BL1 defines the lower surface IS of the touch panel TSP and an upper surface of the second base layer BL2 defines the upper surface OS of the touch panel TSP. The first, second, and third color filters CF-R, CF-G, and CF-B are disposed on the lower surface IS of the touch panel TSP.

A black matrix BM is disposed on the lower surface IS of the touch panel TSP. The black matrix BM includes an organic material having a high light absorptivity. The black matrix BM includes a black pigment or a black dye.

Referring to FIG. 9, the first, second, and third color filters CF-R, CF-G, and CF-B are spaced apart from each other. The first, second, and third color filters CF-R, CF-G, and CF-B may have different colors from each other. The first, second, and third color filters CF-R, CF-G, and CF-B may have red, green, and blue colors, respectively.

Referring to FIGS. 3 and 9, the first, second, and third color filters CF-R, CF-G, and CF-B respectively correspond to the first to third pixel areas PXA(i, j) to PXA(i, j+2). More specifically, the first, second, and third color filters CF-R, CF-G, and CF-B overlaps with the light emitting areas LA(i, j) to LA(i, j+2) of the first to third pixel areas PXA(i, j) to PXA(i, j+2), respectively. The first, second, and third color filters CF-R, CF-G, and CF-B may have substantially the same area as the light emitting areas LA(i, j) to LA(i, j+2). The first, second, and third color filters CF-R, CF-G, and CF-B may also have the area about 10% larger than the light emitting areas LA(i, j) to LA(i, j+2) to completely cover the light emitting areas LA(i, j) to LA(i, j+2).

The black matrix BM corresponds to the non-light emitting area SA. The black matrix BM may also overlap with the circuit areas CA(i, j) to CA(i, j+2) of the first to third pixel areas PXA(i, j) to PXA(i, j+2).

The first, second, and third color filters CF-R, CF-G, and CF-B may reduce a reflectance of the external light reflected on the organic light emitting diode OLED (refer to FIG. 7) disposed in the light emitting areas LA(i, j) to LA(i, j+2). In addition, the first, second, and third color filters CF-R, CF-G, and CF-B may enhance an efficiency of the light exiting from the organic light emitting diode OLED (refer to FIG. 7).

Figure 10:
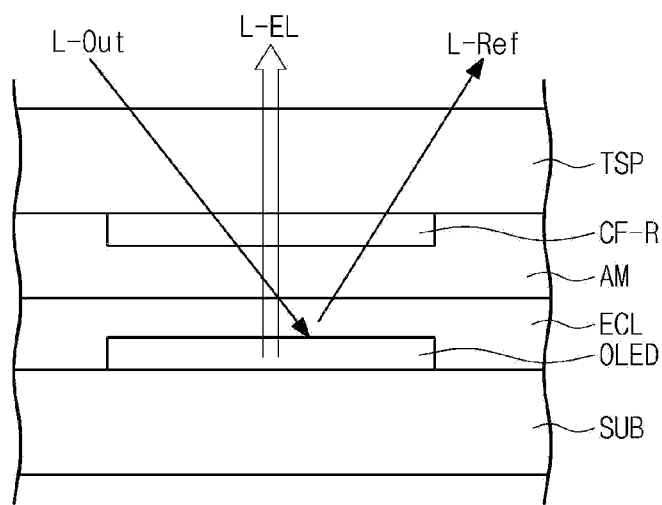
FIG. 10 is a view showing an optical path of a light emitting display device according to an exemplary embodiment of the present disclosure.

FIG. 10 is a view showing an optical path of a light emitting display device according to an exemplary embodiment of the present disclosure. Hereinafter, the first, second, and third color filters CF-R, CF-G, and CF-B will be described in detail with reference to FIG. 10. FIG. 10 shows the first color filter CF-R and the organic light emitting diode OLED of the first pixel area PXA(i, j), which corresponds to the first color filter CF-R.

The organic light emitting diode OLED emits a red light L-EL. The color of the first color filter CF-R may be the red color that is substantially the same as the red light L-EL. The light L-Out incident to the organic light emitting diode OLED is the external light, e.g., a visible light.

An intensity of the incident light L-Out is reduced to about ⅓ while passing through the first color filter CF-R. This is because the visible light has a wavelength range from about 550 nm to about 750 nm for the red light, a wavelength range from about 480 nm to about 550 nm for the green light, and a wavelength range from about 350 nm to about 480 nm for the blue light, but the first color filter CF-R transmits only the red light having the wavelength of about 550 nm to about 750 nm. The first color filter CF-R may further block a portion of the red light having the wavelength of about 550 nm to about 750 nm.

In addition, about ⅓ of the light that passed through the first color filter CF-R is absorbed by the sealing layer ECL. About ⅔ of the light that passed through the first color filter CF-R is reflected on the organic light emitting diode OLED. The intensity of the light L-Ref reflected on the organic light emitting diode OLED is then reduced to about ¾ while passing through the first color filter CF-R again. This is because a portion of the reflected light L-Ref is absorbed by the first color filter CF-R.

Consequently, when the intensity of the incident light L-Out is about 100, the intensity of the reflected light L-Ref is about 15. That is, a reflection efficiency of the external light is about 15%. The intensity of the red light L-EL emitted from the organic light emitting diode OLED is maintained to about ¾ while passing through the first color filter CF-R. That is, an emitted light efficiency with respect to the red light L-EL is about 75%.

Compared to the exemplary embodiment of the present invention, a display device including a polarizing film and a λ/4 wavelength film to prevent the external light from being reflected may have a reflection efficiency of about 5% with respect to the external light and the emitted light efficiency of about 50%. The display device according to the present exemplary embodiment on the other hand, may have the reflection efficiency of the light substantially similar to that of the display device including the polarizing film and the λ/4 wavelength film and, at the same time, have the emitted light efficiency higher than that of the display device including the polarizing film and the λ/4 wavelength film. Therefore, the manufacturing cost of the display device according to the present exemplary embodiment may be reduced by the price of the polarizing film and the λ/4 wavelength film.

In addition, since the first color filter CF-R is disposed on the touch panel TSP, the display panel DP does not need to include a separate substrate for the first color filter CF-R.

Referring to FIGS. 9 and 10, the black matrix BM absorbs the incident light L-Out incident to the non-light emitting area SA. Thus, the incident light L-Out may be prevented from being reflected by the signal lines.

Figure 11:
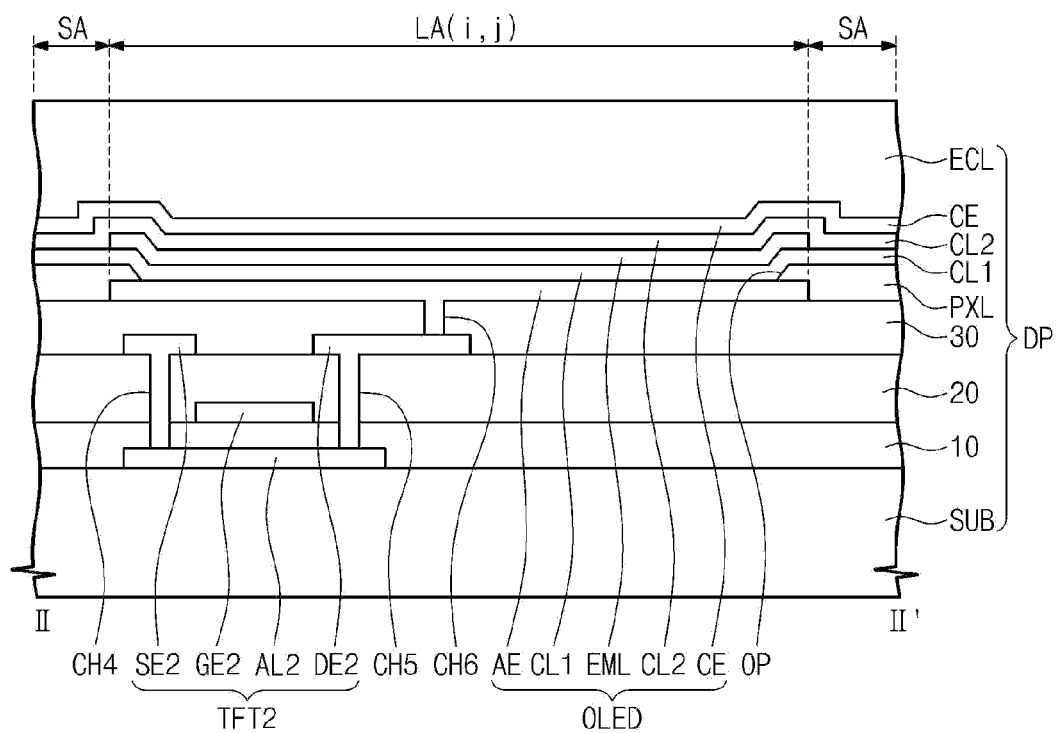
FIG. 11 is a cross-sectional view showing a pixel according to an exemplary embodiment of the present disclosure.

FIG. 11 is a cross-sectional view showing a pixel according to an exemplary embodiment of the present disclosure. Hereinafter, a display device according to the exemplary embodiment will be described in detail. In FIG. 11, the same reference numerals denote the same elements in FIGS. 1 to 10, and thus detailed descriptions of the same elements will be omitted.

Referring to FIG. 11, the anode AE of the organic light emitting diode OLED may overlap with the second thin film transistor TFT2. Accordingly, the area of the light emitting area LA(i, j) is increased.

Although not shown in figures, the anode AE may overlap with the first thin film transistor TFT1 and the capacitor Cap. Therefore, the circuit area CA(i, j) (refer to FIG. 5) may be omitted. The pixel area PXA(i, j) (refer to FIG. 5) may be substantially the same as the light emitting area LA(i, j).

Figure 12:
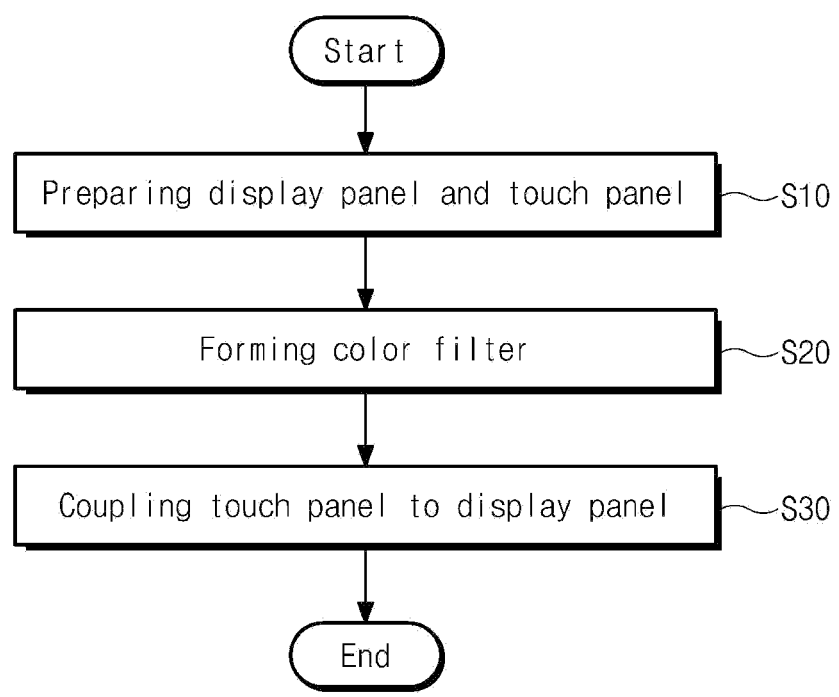
FIG. 12 is a flow chart showing a manufacturing method of a light emitting display device according to an exemplary embodiment of the present disclosure.

FIG. 12 is a flow chart showing a manufacturing method of a light emitting display device according to an exemplary embodiment of the present disclosure. Hereinafter, the manufacturing method of the display device will be described in detail with reference to FIG. 12.

The display panel DP, which includes the pixel areas PXA(i, j) to PXA(i, j+2) and the non-light emitting area SA, and the touch panel TSP are prepared (S10). The display panel DP and the touch panel TSP are manufactured by a conventional manufacturing method. The method of manufacturing the display panel DP and the touch panel TSP includes a process of forming the conductive patterns from the conductive layer. The process includes a deposition process, a photolithography process, an exposure process, and an etching process. The manufacturing method of the display panel DP and the touch panel TSP may further include a process of forming an organic layer or an inorganic layer. The organic layer is formed by a coating or printing process and the inorganic layer is formed by a chemical vapor deposition process.

The color filters CF-R, CF-G, and CF-B are formed on the surface IS of the touch panel TSP (S20). The color filters CF-R, CF-G, and CF-B are formed on the surface IS of the touch panel TSP to correspond to the pixel areas PXA(i, j) to PXA(i, j+2) of the display panel DP. The color filters CF-R, CF-G, and CF-B may be formed by the printing process.

Then, the touch panel TSP and the display panel DP are coupled to each other using the adhesive member AM disposed therebetween. The color filters CF-R, CF-G, and CF-B are disposed between the display surface IDS of the display panel DP and the lower surface IS of the touch panel TSP, and the touch panel TSP and the display panel DP are coupled to each other such that the color filters CF-R, CF-G, and CF-B respectively correspond to the pixel areas PXA(i, j) to PXA(i, j+2).

Before the touch panel TSP and the display panel DP are coupled to each other, the adhesive member AM is provided to the surface IS of the touch panel TSP or to the display surface IDS of the display panel DP.

Before the touch panel TSP and the display panel DP are coupled to each other, the black matrix BM is formed on the surface IS of the touch panel TSP. The black matrix BM formed on the surface IS of the touch panel TSP corresponds to at least the non-light emitting area SA. The black matrix BM is formed by a printing process.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A light emitting display device, comprising:
a display panel comprising:
light emitting areas;
a non-light emitting area disposed adjacent to the light emitting areas;
light emitting devices respectively disposed in the light emitting areas; and
a sealing layer disposed to directly cover the light emitting devices; and
a touch panel disposed on the display panel, the touch panel comprising color filters respectively facing the light emitting areas,
wherein the light emitting devices comprise a first light emitting device configured to display a first color and a second light emitting device configured to display a second color which is different from the first color,
wherein the color filters comprise a first color filter having the first color and a second color filter having the second color, and
wherein the sealing layer is disposed between the light emitting devices and the color filters.

2. The light emitting display device of claim 1, further comprising an adhesive member configured to adhere an upper surface of the display panel and a lower surface of the touch panel.

3. The light emitting display device of claim 1, wherein the touch panel comprise:
a first base substrate comprising an upper surface and an opposing lower surface; and
a conductive layer disposed on the upper surface of the first base substrate,
wherein the color filters are disposed on the lower surface of the first base substrate.

4. The light emitting display device of claim 1, wherein the light emitting devices comprises organic light emitting diodes.

5. The light emitting display device of claim 1, wherein the touch panel further comprises a black matrix facing the non-light emitting area.

6. The light emitting display device of claim 5, wherein the black matrix is disposed on a same layer as the color filters.

7. The light emitting display device of claim 1, wherein the display panel comprises:
a second base substrate;
a light emitting device layer disposed on the second base substrate, the light emitting device layer comprising the light emitting devices; and
the sealing layer disposed on the light emitting device layer, the sealing layer configured to protect the light emitting device layer.

8. The light emitting display device of claim 7, wherein the sealing layer comprises inorganic layers.

9. The light emitting display device of claim 7, wherein each of the light emitting devices has a substantially the same area as a corresponding one of the light emitting areas when viewed in a plan view.

10. A light emitting display device, comprising:
a display panel comprising:
a first pixel area;
a second pixel area;
a non-light emitting area disposed adjacent to the first pixel area and the second pixel area;
a first light emitting device and a second light emitting device respectively facing the first pixel area and the second pixel area; and
a sealing layer overlapping the first light emitting device and the second light emitting device; and
a touch panel disposed on the display panel, the touch panel comprising a first color filter and a second color filter respectively facing the first pixel area and the second pixel area; and
an adhesive member configured to adhere an upper surface of the display panel and a lower surface of the touch panel,
wherein the first light emitting device and the second light emitting device display different colors from each other,
wherein the first color filter and the second color filter respectively have same color as a color displayed by the corresponding light emitting device,
wherein the sealing layer is disposed between the first and second light emitting devices and the color filters, and
wherein the first color filter is configured to transmit about 75% of light emitted from the corresponding light emitting device.

11. The light emitting display device of claim 10, wherein each of the first light emitting device and the second light emitting devices comprises an organic light emitting diode.

12. The light emitting display device of claim 10, wherein the first color filter and the second color filter are disposed on the lower surface of the touch panel.

13. The light emitting display device of claim 10, wherein the touch panel further comprises a black matrix disposed on the lower surface of the touch panel and facing the non-light emitting area.

14. The light emitting display device of claim 10, wherein each of the first pixel area and the second pixel area comprises:
a light emitting area comprising one of the first light emitting device and the second light emitting device; and
a circuit area comprising a circuit part configured to control the first light emitting device or second light emitting device.

15. The light emitting display device of claim 14, wherein each of the first color filter and the second color filter overlaps the light emitting area.

16. A method of manufacturing a light emitting display device, comprising:
forming a first color filter and a second color filter respectively on a surface of a touch panel, the first color filter and the second color filter respectively corresponding a first pixel area and a second pixel area of a display panel; and
attaching the touch panel to the display panel, such that the first color filter and the second color filter are disposed between the touch panel and the display panel, the first color filter and the second color filter respectively facing the first pixel area and the second pixel area,
wherein the display panel comprises a first light emitting device, a second light emitting device display different colors from each other, and a sealing layer overlapping the first light emitting device and the second light emitting device,
wherein the first color filter and the second color filter respectively have same color as a color displayed by the corresponding light emitting device, wherein the sealing layer is disposed between the first and second light emitting devices and the color filters, and wherein the first color filter is configured to transmit about 75% of light having the first color emitted from the first light emitting device.

17. The method of claim 16, further comprising disposing an adhesive member on the surface of the touch panel or on the surface of the display panel, before attaching the touch panel to the display panel.

18. The method of claim 16, further comprising forming a black matrix on the surface of the touch panel and facing the non-light emitting area, before attaching the touch panel to the display panel.

\* \* \* \* \*